(12) United States Patent
Bielesch et al.

(10) Patent No.: US 10,763,014 B2
(45) Date of Patent: Sep. 1, 2020

(54) METHOD FOR PRODUCING AN ELECTRICAL CONDUCTOR

(71) Applicant: Mahle International GmbH, Stuttgart (DE)

(72) Inventors: Thomas Bielesch, Muehlacker (DE); Michael Boehm, Kanagawa-ken (JP); Wojciech Stasch, Stuttgart (DE)

(73) Assignee: Mahle International GmbH (DE)

( * ) Notice: Subject to any disclaimer, the term of this patent is extended or adjusted under 35 U.S.C. 154(b) by 13 days.

(21) Appl. No.: 16/396,307

(22) Filed: Apr. 26, 2019

(65) Prior Publication Data

US 2019/0333659 A1 Oct. 31, 2019

(30) Foreign Application Priority Data

Apr. 27, 2018 (DE) .................. 10 2018 206 617

(51) Int. Cl.
| | |
|---|---|
| *H01R 13/00* | (2006.01) |
| *H01B 13/00* | (2006.01) |
| *H01B 5/02* | (2006.01) |
| *H01B 7/18* | (2006.01) |
| *H01R 12/75* | (2011.01) |
| *H01R 31/06* | (2006.01) |
| *H01R 12/70* | (2011.01) |
| *H05K 1/18* | (2006.01) |

(52) U.S. Cl.
CPC .......... *H01B 13/0013* (2013.01); *H01B 5/02* (2013.01); *H01B 7/184* (2013.01); *H01R 12/707* (2013.01); *H01R 12/75* (2013.01); *H01R 31/06* (2013.01); *H05K 1/183* (2013.01)

(58) Field of Classification Search
CPC .... H01R 13/0013; H01R 31/06; H01R 43/24; H01R 43/16; H05K 2201/10303
USPC ........................................................ 174/126.1
See application file for complete search history.

(56) References Cited

U.S. PATENT DOCUMENTS

| | | | |
|---|---|---|---|
| 4,038,743 | A | 8/1977 | DuRocher et al. |
| 10,021,788 | B2 | 7/2018 | Ullermann et al. |
| 10,102,945 | B2 | 10/2018 | Miyakawa et al. |
| 2002/0043882 | A1 | 4/2002 | Tanaka et al. |
| 2006/0121773 | A1 | 6/2006 | Ichikawa et al. |
| 2012/0000069 | A1* | 1/2012 | Hagi ............... H01R 43/28 29/864 |
| 2014/0035406 | A1* | 2/2014 | Ishizuka ............... H02K 15/024 310/71 |
| 2015/0345537 | A1 | 12/2015 | Wiley et al. |
| 2017/0229211 | A1* | 8/2017 | Yoshida ............... H01B 7/0045 |
| 2018/0317334 | A1 | 11/2018 | Grotz et al. |

FOREIGN PATENT DOCUMENTS

| | | |
|---|---|---|
| DE | 102014006360 A1 | 11/2015 |
| DE | 20 2016 101 623 U1 | 6/2016 |
| DE | 102016210045 A1 | 12/2016 |

* cited by examiner

*Primary Examiner* — Sherman Ng
(74) *Attorney, Agent, or Firm* — Fishman Stewart PLLC

(57) ABSTRACT

A method for producing an electrical conductor may include cutting an electrically conductive round wire composed of copper to a predefined desired length and plastically forming the round wire, in at least one forming section, into a predefined desired shape.

18 Claims, 4 Drawing Sheets

METHOD FOR PRODUCING AN ELECTRICAL CONDUCTOR

CROSS-REFERENCE TO RELATED APPLICATION

This application claims priority to German Application No. DE 10 2018 206 617.5, filed on Apr. 27, 2018, the contents of which are hereby incorporated by reference in its entirety.

TECHNICAL FIELD

The invention relates to a method for producing an electrical conductor and to an electrical conductor for conducting electric current that is produced by means of this method. The invention, furthermore, relates to an electrical/electronic component having at least one such electrical conductor or to an electrical/electronic component that is connected to at least one such electrical conductor.

BACKGROUND

For the electrical contacting and for the electric current conduction in electric/electronic components different types of current conductors and electrical contacts are employed. In particular in automotive engineering, current conductors and contacts are used the manufacture of which—often due to the design—involves major expenditure and thus high manufacturing costs. For the electric current conduction and the electrical contacting of the same, so-called flat conductors made of copper are often used, which are moulded according to the requirements and subsequently injection-overmoulded with plastic. In this way, complete plug systems are created.

In particular for the electric current conduction in BLDC direct current motors, flat conductor contacts are frequently used which connect the three phases of the stator windings of the motor with an electronic control system. Such flat conductors can be routed in the housing interior of a housing which the electronic control system is arranged.

The manufacture of said electrical flat conductors however is typically relatively involved technically and thus cost-intensive.

SUMMARY

It is therefore an object of the present invention to create a method for producing an electrical conductor with which the disadvantages mentioned above are at least partly, ideally completely, eliminated.

This object is solved through the subject of the independent patent claim(s). Preferred embodiments are subject of the dependent patent claim(s).

Accordingly, the basic idea of the invention is to not utilise the flat conductors mentioned at the outset for producing electric current conductors but using commercially available round wires made of copper as they are typically used in electrical conductor cables for the power installation in domestic and industrial applications. Any wire with a round, preferentially circular line cross section is considered a round wire. In the present context, this expressly does not include any stranded wires. In the initial state, said round wires are not electrically insulated relative to the external environment and can be delivered wound on suitable coil bodies.

According to the invention, such an electrically conductive round wire made of copper is cut to the desired length and subsequently plastically deformed according to user-specific requirement so that the forming section of the round wire after forming has the desired shape. In this way, manifold electrical conductors for current conduction can be cost-effectively realised which through suitable design of said forming sections are suitable for a multiplicity of applications. It is conceivable, in particular, to realise plug contacts for the electrical contacting of further electric/electronic components using said forming sections. It is also conceivable to design such a forming section for receiving a sealing element when the electrical conductor is to be fed through a housing.

As a result, substantial cost advantages materialise compared with the flat conductors mentioned at the outset, in particular because of the use of a commercially available round wire.

The method for producing an electrical conductor according to the invention comprises a first step a), according to which a round wire made of copper is cut to a predefined desired length. The method, furthermore, comprises a second method step b), according to which at least one section of the round wire—this section is referred to as "forming section" in the following—is formed into a predefined desired shape.

Practically, the round wire 1 has a round, particularly preferably a circular cross section. A diameter of the round wire is preferably between 1 mm and 5 mm.

According to a preferred embodiment, the plastic deformation of the at least one forming section is performed by pressing the same in a predetermined press mould. By using suitable press moulds, the forming section can be moulded in almost any way.

According to an advantageous further development, a recess is formed through the plastic deformation of the at least one forming section. Such a recess can form a zone on which an adapter component for electrically connecting the electrical conductor to further electrical/electronic components can be fastened. However, also conceivable is an arrangement of other components which are in particular not designed electrically conductive such as for example a sealing element or similar.

According to a further advantageous further development, the recess in a cross section perpendicularly to the extension direction, along which the round wire extends in the region of the forming section, has the geometry of a segment of a circle. Thus, a flat surface is formed in the region of the forming section which is particularly suitable for the electrical contacting of the said adapter component or for the direct electrical contacting of further electric/electronic components.

According to a further advantageous further development, the method comprises an additional method step c). According to this method step c), the round wire is bent in at least one zone—in the following, this zone is referred to as "bending zone"—so that the two wire sections projecting from the bending zone are arranged at an angle relative to one another. The formed angle can be an acute angle or an obtuse angle or a right angle. This method step allows adapting the extension direction of the round wire along its longitudinal extension to any user-specific requirements. It goes without saying that two or more such bending zones can be provided.

According to another preferred embodiment, the at least one forming section is an end section that is arranged at one of the two extension ends of the round wire extending along the extension direction. Accordingly, the at least one forming section after the forming can be used for the electrical connecting of one or both of its longitudinal ends to a further electrical/electronic component. According to another further preferred embodiment, the at least one forming section is an intermediate section which is arranged spaced from the two extension ends of the round wire. This allows connecting the round wire to an electrical/electronic component in a region between both of its longitudinal ends after the forming. It goes without saying that it is also possible to arrange components with non-electrical/non-electronic function on the intermediate section. Such components include in particular sealing elements.

According to a preferred embodiment, a sealing element, preferentially made of silicone, is therefore arranged in the at least one recess and forms an intermediate section. This measure proves to be advantageous when the electrical conductor is fed through a passage opening provided in a housing, wherein the housing interior limited by the housing is to be sealed relative to the external environment of the housing.

According to an advantageous further development, the plastic deformation does not only take place in a single forming section but in at least two forming sections, preferentially in a plurality of forming sections.

According to an advantageous further development, the at least one forming section is formed into an electrical contact section which, preferentially by means of a welded connection or by means of a soldered connection, is electrically contactable. This measure facilitates the electrical connecting or attaching of a further electrical/electronic component on the round wire.

In a further method step, an electrically conductive adapter component preferentially designed angularly and/or comprising two component legs can be connected to the electrical contact section in a firmly bonded and electrically conductive manner. Such an adapter component makes possible adapting the geometry of the round wire to that of the electrical/electronic element to be connected to the round wire. In this way, a durable reliable mechanical and electrical connection between the round wire and the electrical/electronic element can be ensured.

According to an advantageous further development, the electrical conductor or the round wire made of copper is sheathed with an electrically insulating plastic in at least one section between the two extension ends or between the two end sections. This makes possible electrically insulating the electrically conductive round wire relative to its external environment in a simple manner.

Practically, the sheathing of the electrical conductor or of the round wire made of copper is effected by injection overmoulding with the plastic. Such an injection method proves to be highly flexible so that with the help of the method steps a) and b) round wires worked in various ways can be provided with a plastic sheathing.

According to another preferred embodiment, the at least one forming section is roughened and thereafter pressed into an electrical/electronic component, in particular into a circuit board. This allows a simple electrical connection between the round wire and the electrical component, in particular when the component is a circuit board with electrical conductor tracks, preferentially made of copper.

In an advantageous further development, after the at least one forming section has been pressed into the component, in particular into the circuit board, said forming section is electrically connected to at least one conductor track provided on the component, in particular on the circuit board, using a soldered connection. This measure improves the contacting of the round wire on the electrical component.

Particularly preferably, a cutting ring or spring ring can be attached in a contact region of the forming section with the circuit board after the creation of the soldered connection. This measure also improves the contacting of the round wire on the electrical component.

The invention, furthermore, relates to an electrical conductor which is produced using the method introduced above. The advantages of the method explained above therefore apply also to the electrical conductor according to the invention.

The invention also relates to an electrical and/or electronic component which comprises at least one electrical conductor introduced above or is connected to such an electrical conductor. The advantages of the electrical conductor explained above therefore apply also to the electrical or electronic component according to the invention.

It is to be understood that the features mentioned above and still to be explained in the following cannot only be used in the respective combination stated but also in other combinations or by themselves without leaving the scope of the present invention.

The present disclosure thus comprises in particular also all combinations that can materialise by any combination of the mentioned embodiments and further developments—insofar as practical.

Further important features and advantages of the invention are obtained from the subclaims, from the drawings and from the associated figure description by way of the drawings.

Preferred exemplary embodiments of the invention are shown in the drawings and are explained in more detail in the following description, wherein same reference characters relate to same or similar or functionally same components.

BRIEF DESCRIPTION OF THE DRAWINGS

It shows, in each case schematically.

DETAILED DESCRIPTION

Figure 1:
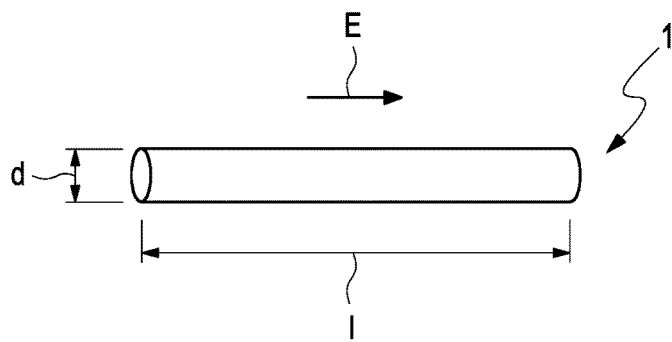
FIGS. 1a through 1c are representations illustrating the individual method steps of the method for producing an electrical conductor according to the invention.
Figure 1:
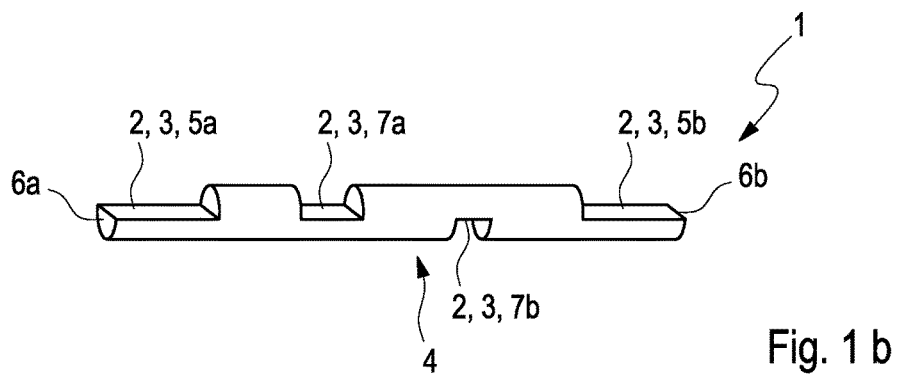
Figure 1:
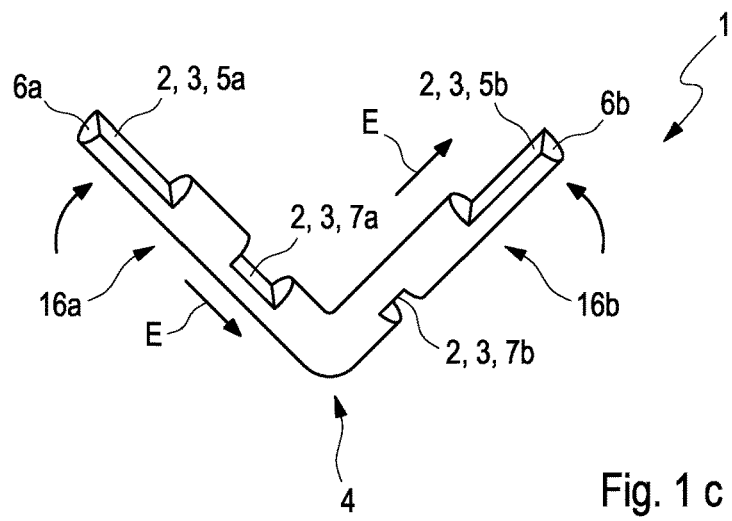

In the following, the method for producing an electrical conductor according to the invention is exemplarily explained by way of the FIGS. 1a to 1c. According to FIG. 1a, a round wire 1 made of copper is cut to a predefined desired length l in a first method step a). The round wire 1 has a round, preferentially a circular cross section. A diameter d of the round wire is preferably between 1 mm and 5 mm. FIG. 1a shows the round wire 1 after a) has been carried out. In a second method step b), multiple forming sections 2 of the round wire 1 are each plastically formed into a predefined desired shape. FIG. 1b shows the round wire 1 after step b) has been carried out. The plastic deformation of the forming sections is preferentially effected by pressing in a predetermined press mould (not shown).

As is evident from FIG. 1b, a respective recess 3 is formed in the forming sections 2 through the plastic deformation of the round wire. As is additionally evident from FIG. 1b, the recesses 3 have the geometry of a segment of a circle in a cross section perpendicularly to an extension direction E of the round wire 1, along which the round wire 2 extends in each case in the region of the forming sections 2.

According to FIG. 1c, the method can comprise an additional step c). According to step c), the round wire 1 is bent in a bending zone 4 namely in such a manner that the two wire sections 16a, 16b projecting from the bending zone 4 are arranged, after the bending, at an acute or obtuse angle (not shown) or, as shown in FIG. 1c, at a right angle relative to one another. FIG. 1c shows the round wire 1 after step c) has been carried out. It goes without saying that the round wire 1 cannot only be bent in a single bending zone 4 as exemplarily shown in FIG. 1, but in two or more such bending zones 4.

The sequence of the method steps b) and c) can also be switched.

In the example of the FIGS. 1a to 1c, two of the four existing forming sections 2 are end sections 5a, 5b of the round wire 1, which are arranged on the opposite extension ends 6a, 6b of the round wire 1 extending along the extension direction E. The two remaining forming sections 2 are intermediate sections 7a, 7b which are each arranged spaced from the two extension ends 6a, 6b or the end sections 5a, 5b of the round wire 1.

Figure 2:
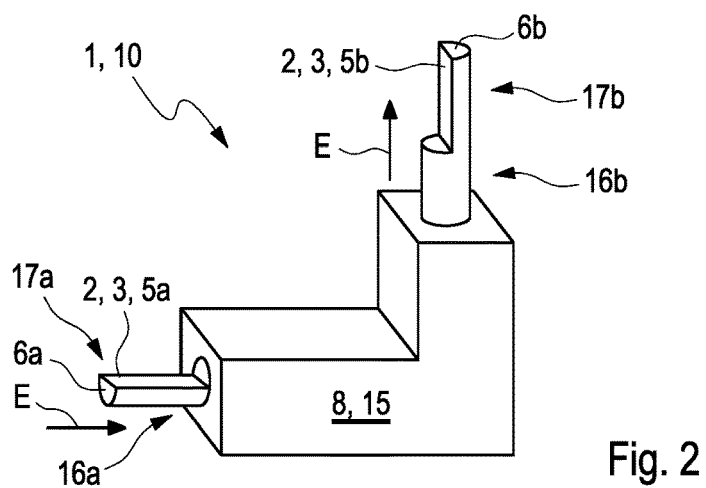
FIG. 2 shows a further development of the electrical conductor produced by means of the method according to the invention.

FIG. 2 shows a further development of the electrical conductor 10 produced according to the FIGS. 1a to 1c. Accordingly, the electrical conductor 10 is sheathed with an electrically insulating plastic 15 in a section between the two extension ends 6a, 6b or between the two end sections 5a, 5b. The formed sheathing 8 can be carried out by way of an injection moulding operation, i.e. by injection overmoulding the round wire 1 made of copper with the plastic 15. As is exemplarily shown in FIG. 2, the sheathing 8 can have a geometrical shape other than that of the round wire 1. In particular, a geometrical shape deviating from a round geometry can be selected as is the case with the casing-like sheathing 8 with angular geometry shown in FIG. 2. The method introduced here thus allows a particularly flexible adaptation of the geometrical shape of the sheathing 8 to user-specific requirements. The two ends sections 5a, 5b are not sheathed at least in the example of the figures so that they form electrical plug contacts 17a, 17b, via which the round wire 1 or the electrical conductor 10 can be connected to other electrical/electronic components (not shown in FIG. 2) in an electrically conductive manner.

Figure 3:
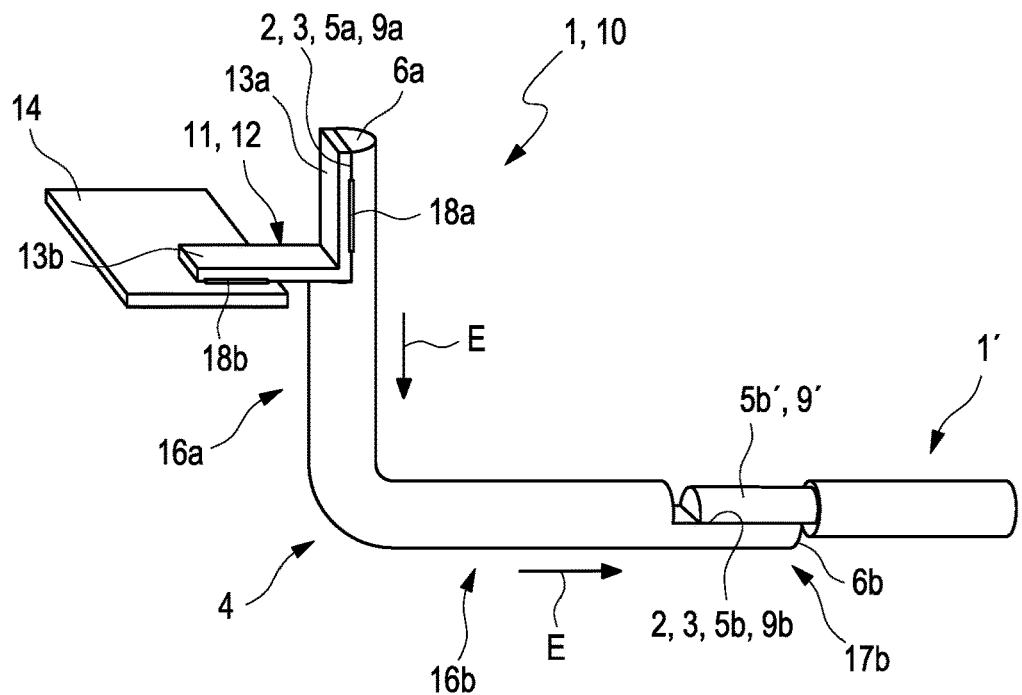
FIG. 3 shows a representation illustrating an additional method step.

FIG. 3 illustrates another further development of the method which can be combined in particular with the further development of FIG. 2. Accordingly, the forming section 2 designed as end section 5a can be formed into an electrical contact section 9a which, preferentially by means of a welded connection or by means of a soldered connection, can be electrically contacted to an electrically conductive element 11. This element 11 can be for example an electrically conductive adapter component 2 with two component legs 13a, 13b that is formed angularly, preferentially at a right angle. A first component leg 13a can be connected to the contact section 9 of the round wire 1 in a firmly bonded manner, preferentially by means of a welded or soldered connection 18a. A second component leg 13b of the adapter component 12 serves for electrically connecting or contacting to a further electrical/electronic component 14. This can likewise be effected by means of a firmly bonded connection, preferentially by means of a welded or soldered connection 18b. In this way, any electrical/electronic components 14 can be electrically connected to the electrical conductor 10 or with the round wire 1. In the example of FIG. 3, the forming section 2 designed as end section 5b, which realises a contacting section 9b, is connected to an end section 5b' of a further round wire 1', which likewise forms a contacting section 9b', for example by means of a soldered or welded connection.

Figure 4:
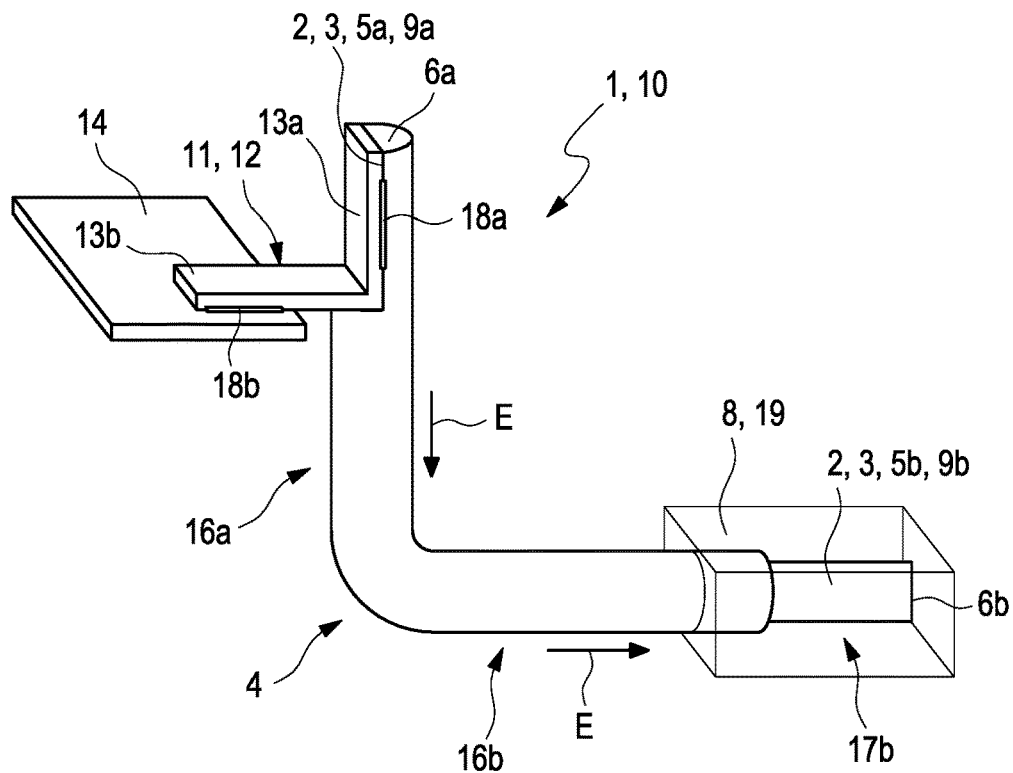
FIG. 4 shows a version of the example of FIG. 3.

FIG. 4 illustrates a version of the example of FIG. 3. In the example of FIG. 4, a plug housing 19 of an electrically insulating plastic is arranged on the second end section 5b or on the second extension end 6b, which surrounds the electrically conductive plug contact 7b in an electrically insulating manner.

Figure 5:
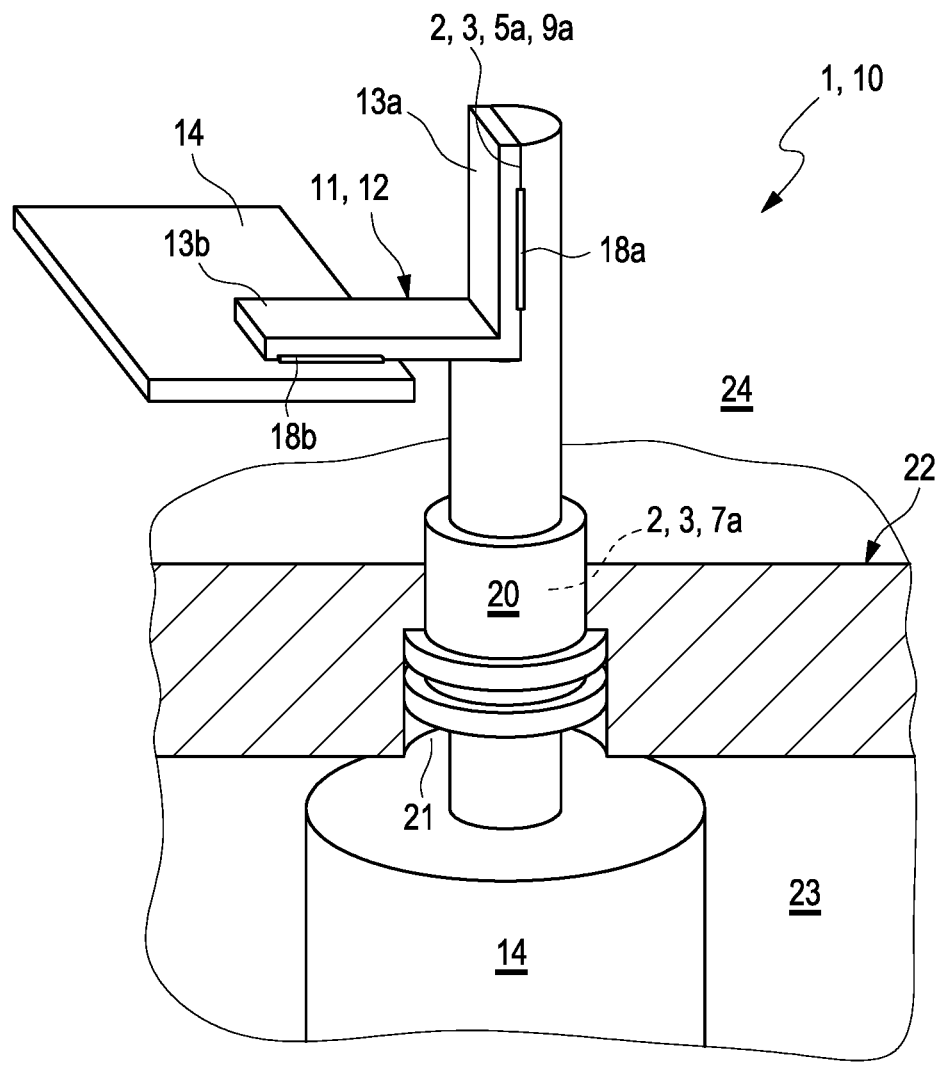
FIG. 5 shows a further development of the example of FIG. 3.

FIG. 5 illustrates a further development of the example of FIG. 4. In the example of FIG. 5, a sealing element 20 is arranged in an intermediate section 7a formed as a recess 3, which is designed for example as a silicone seal. In the example of FIG. 5, the electrical conductor 10 or the round wire 1 is fed through a passage opening 21, which is present in a housing 22 of an electrical/electronic component 14. By means of the sealing element 20, the housing interior limited by the housing 22 is sealed relative to the external environment 24.

Figure 6:
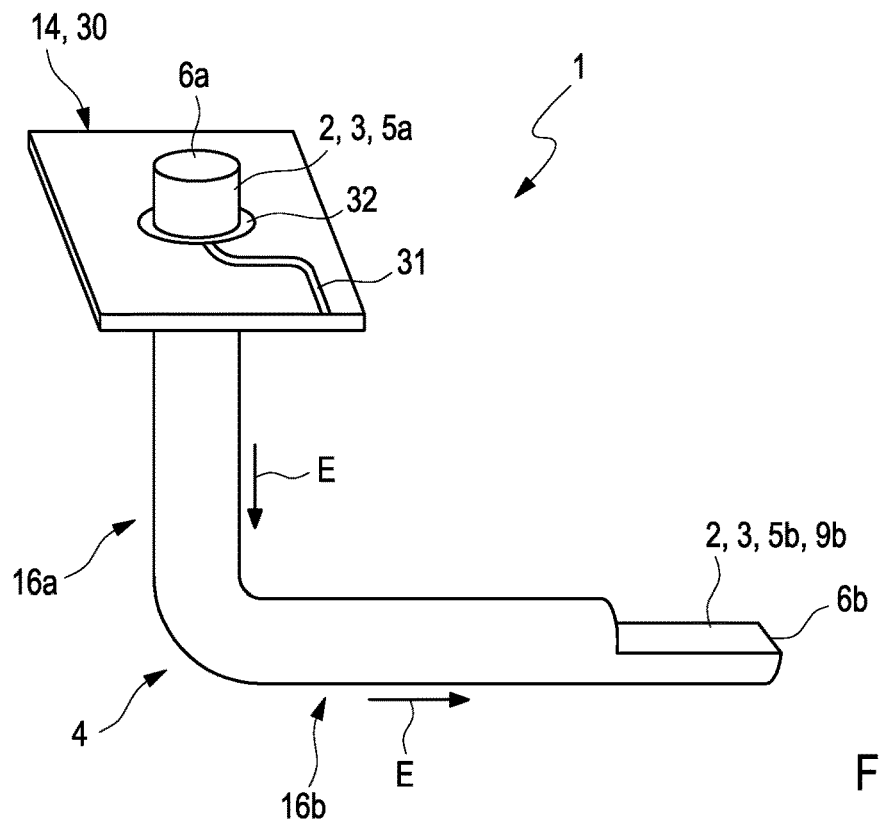
FIG. 6 shows an alternative version of the example of FIG. 3.

FIG. 6 shows a further version of the method according to the invention. In this version, the forming section 2—other than explained in particular in the example of FIG. 3—is not formed into a contact section 9a but instead roughened and subsequently pressed into the electrical/electronic component 14, which is a circuit board 30. By the pressing-in, an electrical connection of the forming section 2 of the round wire 1 with a conductor track 31 that is present on the circuit board 30 is established. The forming section 2 can also be pressed through the circuit board 30 as shown in FIG. 6. Such an electrical contacting can be improved by providing a soldered connection 32 in the contact region 33 of the forming section 2 with the circuit board 30 as shown in FIG. 6. The contacting can also be improved by an additional press connection. In a simplified version, the roughing up can be omitted.

Figure 7:
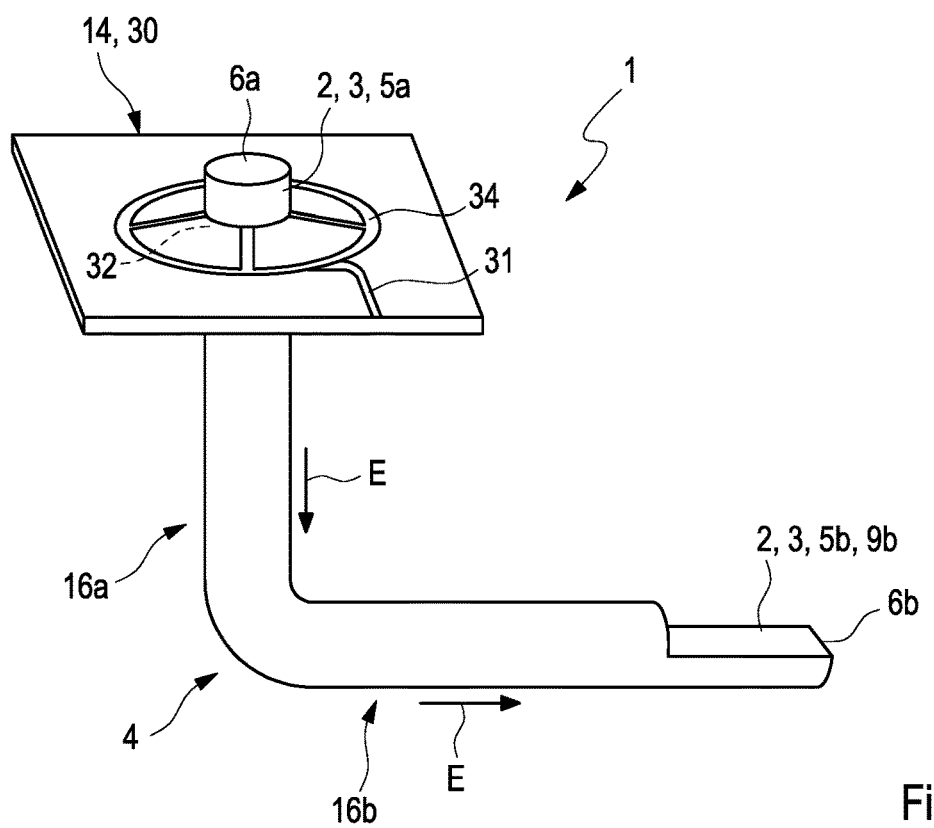
FIG. 7 shows a further development of the example of FIG. 6.

FIG. 7 shows a further development of the example of FIG. 6. In the example of FIG. 7, the contacting of the forming section 2 with the circuit board 30 is improved by attaching a cutting ring or spring ring 34.

The invention claimed is:

1. A method for producing an electrical conductor, comprising:
   cutting an electrically conductive round wire composed of copper to a predefined desired length;
   plastically forming the round wire, in at least one forming section, into a predefined desired shape;
   bending the round wire in at least one bending zone such that two wire sections
   projecting from the at least one bending zone are arranged angularly relative to one another; and
   roughening the at least one forming section and subsequently pressing the at least one forming section into an electrical/electronic component.

2. The method according to claim 1, wherein plastically forming the round wire includes pressing the at least one forming section in a predetermined press mould.

3. The method according to claim 1, wherein plastically forming round wire includes forming a recess in the round wire.

4. The method according to claim 3, wherein the recess has a geometry of a segment of a circle in a cross section perpendicular to an extension direction along which the round wire extends in a region of the at least one forming section.

5. The method according to claim 1, wherein the at least one forming section is an end section of the round wire arranged on one of two extension ends of the round wire extending along an extension direction.

6. The method according to claim 1, wherein the at least one forming section is an intermediate section of the round wire arranged spaced from two extension ends of the round wire.

7. The method according to claim 3, further comprising arranging a sealing element in the recess, the recess defining an intermediate section of the round wire.

8. The method according to claim 1, wherein the at least one forming section includes at least two forming sections.

9. The method according to claim 1, further comprising forming the at least one forming section into an electrical contact section which is electrically contactable.

10. The method according to claim 9, further comprising connecting an electrically conductive adapter component to the contact section in a firmly bonded and electrically conductive manner.

11. The method according to claim 1, further comprising sheathing the round wire with an electrically insulating plastic in at least one section disposed at least one of between two extension ends of the round wire and between two end sections of the round wire.

12. The method according to claim 11, wherein sheathing the round wire includes injection overmoulding the round wire with the electrically insulating plastic.

13. The method according to claim 1, further comprising, subsequent to pressing the at least one forming section into the electrical/electronic component, electrically connecting the at least one forming section via a soldered connection to at least one conductor track of the electrical/electronic component.

14. The method according to claim 13, further comprising, subsequent to electrically connecting the at least one forming section via the soldered connection to the at least one conductor track, attaching at least one of a cutting ring and a spring ring.

15. The method according to claim 1,
wherein the electrical/electronic component is structured as a circuit board.

16. The method according to claim 9, further comprising connecting an electrically conductive adapter component including two component legs to the contact section in an electrically conductive manner.

17. An electrical conductor for conducting electric current, produced by:
cutting an electrically conductive round wire composed of copper to a predefined desired
length;
plastically forming the round wire, in at least one forming section, into a predefined desired shape;
bending the round wire in at least one bending zone such that two wire sections
projecting from the at least one bending zone are arranged angularly relative to one another; and
roughening the at least one forming section and subsequently pressing the at least one forming section into an electrical/electronic component.

18. An electrical/electronic component, comprising a body and at
least one electrical conductor including an electrically conductive round copper wire having a
predefined desired length and at least one forming section;
wherein the wire is plastically formed to a predefined desired shape in the at least one
forming section;
wherein the wire is bent in at least one bending zone such that two wire sections
projecting from the at least one bending zone are arranged angularly relative to one another;
wherein the at least one forming section is roughened; and
wherein the body is electrically connected to the at least one forming section of the at least one electrical conductor via a pressed-in connection.

* * * * *